(12) United States Patent
Onishi et al.

(10) Patent No.: US 8,040,707 B2
(45) Date of Patent: Oct. 18, 2011

(54) POWER CONVERTER

(75) Inventors: Hiroyuki Onishi, Aichi-ken (JP); Toshiaki Nagase, Aichi-ken (JP); Jun Ishikawa, Kariya (JP); Kazuyoshi Kontani, Kariya (JP); Toshinari Fukatsu, Kariya (JP)

(73) Assignee: Kabushiki Kaisha Toyota Jidoshokki (JP)

( * ) Notice: Subject to any disclaimer, the term of this patent is extended or adjusted under 35 U.S.C. 154(b) by 429 days.

(21) Appl. No.: 12/397,215

(22) Filed: Mar. 3, 2009

(65) Prior Publication Data
US 2009/0225577 A1 Sep. 10, 2009

(30) Foreign Application Priority Data

Mar. 4, 2008 (JP) ................. P2008-054051

(51) Int. Cl.
*H02M 1/00* (2007.01)
*H01B 11/02* (2006.01)
*H02B 1/26* (2006.01)
(52) U.S. Cl. ............ 363/144; 307/147; 361/624
(58) Field of Classification Search .......... 363/132, 363/144, 145; 307/113, 125, 126, 147, 151; 361/611, 624, 631, 637, 639, 643, 647, 648, 361/782, 783
See application file for complete search history.

(56) References Cited

U.S. PATENT DOCUMENTS

| 5,623,399 | A | * | 4/1997 | Ishii et al. | 363/132 |
|---|---|---|---|---|---|
| 5,671,134 | A | * | 9/1997 | Nomura et al. | 363/132 |
| 6,111,328 | A | * | 8/2000 | Ota et al. | 307/147 |
| 6,456,515 | B1 | * | 9/2002 | Rose, Sr. | 363/144 |
| 2002/0034089 | A1 | * | 3/2002 | Mori et al. | 363/147 |

FOREIGN PATENT DOCUMENTS

JP 2005-347561 A 12/2005

\* cited by examiner

*Primary Examiner* — Matthew Nguyen
(74) *Attorney, Agent, or Firm* — Woodcock Washburn LLP

(57) ABSTRACT

A power converter includes a base plate having thereon a switching device, and positive and negative conductors respectively including main portions disposed parallel to the base plate. One of the main portions is placed over the other of the main portions. The main portions are disposed adjacent to and parallel to each other. The main portions are insulated from each other. The power converter includes a capacitor having positive and negative terminals electrically connected to the respective main portions of the positive and negative conductors. Each of the positive and negative conductors includes a side portion extending from the main portion toward the base plate, and a terminal portion extending from the side portion and joined to the base plate. The side portion is formed with a cutout extending from the end adjacent to the base plate to the opposite end connected to the main portion.

7 Claims, 9 Drawing Sheets

POWER CONVERTER

CROSS REFERENCE TO RELATED APPLICATION

This application claims priority to Japanese Application No. 2008-054051 filed Mar. 4, 2008.

BACKGROUND

The present invention relates to a power converter.

Figure 11A:
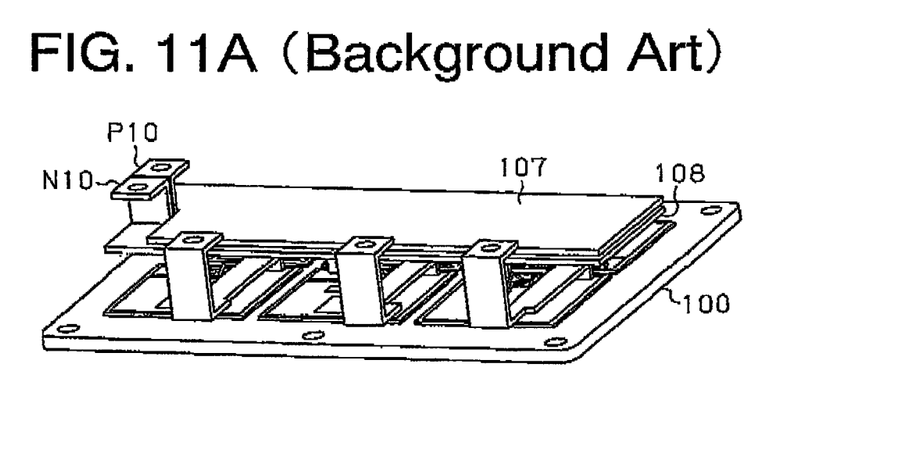
FIG. 11A is a perspective view of a power converter as a background art.
Figure 11B:
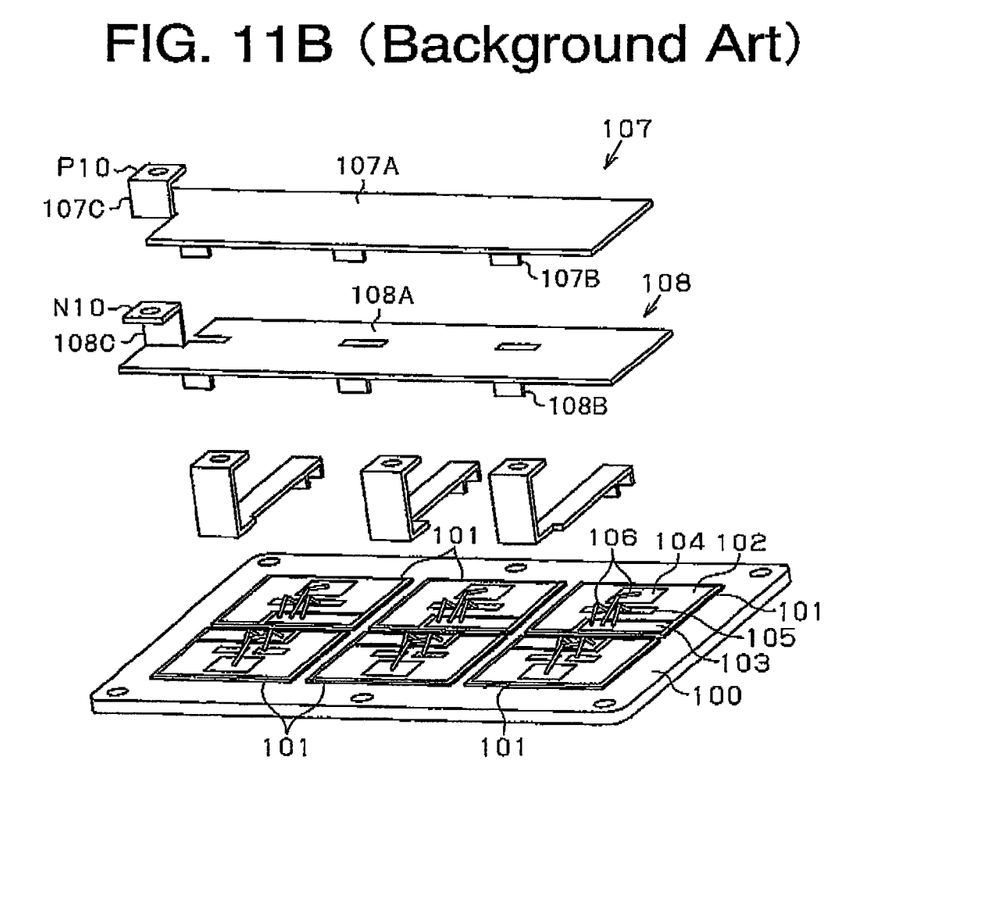
FIG. 11B is an exploded perspective view of the power converter of FIG. 11A.

Japanese Unexamined Patent Application Publication No. 2005-347561 discloses a power converter that includes a switching device and a capacitor and is directed to reducing parasitic line inductance. In such power converter, six insulating substrates 101 are mounted on a base plate 100, as schematically shown in FIGS. 11A and 11B. A collector pattern 102 and an emitter pattern 103 are formed on each insulating substrate 101. A switching chip 104 and a diode chip 105 are mounted on the collector pattern 102 and connected to the emitter pattern 103 by bonding wires 106. A positive conductor 107 is connected to the insulating substrates 101 by a connecting portion 107B thereof extending downward from a plate-shaped main portion 107A. Similarly, a negative conductor 108 is connected to the insulating substrates 101 by a connecting portion 108B thereof extending downward from a plate-shaped main portion 108A. The main portions 107A and 108A of the positive and negative conductors 107 and 108 are arranged one over the other and insulated from each other so as to form a laminate. Terminal portions 107C and 108C in the form of a strip are provided at the end of the main portions 107A and 108A, respectively. The terminal portions 107C and 108C are disposed adjacent to and insulated from each other. The ends of the respective terminal portions 107C and 108C form external terminals P10 and N10.

In the above-described power converter wherein a plate-shaped connecting portion is formed by bending a part of the main portions 107A and 108A, stress may be applied to the connections between the positive and negative conductors 107 and 108 and the insulating substrates 101 due to thermal deformation of the base plate 100. In such a case, the strength of the connection is lowered and the reliability of the power converter is decreased, accordingly. Specifically, the stress may be caused by difference in thermal expansion coefficient between the base plate 100 and the insulating substrate 101 under thermal cycle conditions. Alternatively, the stress may be caused by difference in the thermal expansion coefficient between the base plate 100 and the insulating substrate 101 in mounting the positive and negative conductors 107 and 108 on the insulating substrate 101.

The present invention is directed to providing a power converter in which a connection between a conductor and a base plate is less affected by thermal deformation of the base plate.

SUMMARY

In accordance with an aspect of the present invention, a power converter includes a base plate having thereon a switching device, and a positive conductor and a negative conductor respectively including plate-shaped main portions being disposed parallel to the base plate. One of the main portions of the positive and negative conductors is placed over the other of the main portions of the positive and negative conductors. The main portions of the positive and negative conductors are disposed adjacent to and parallel to each other. The main portions of the positive and negative conductors are insulated from each other. The power converter includes a capacitor having a positive terminal and a negative terminal being electrically connected to the respective main portions of the positive and negative conductors. Each of the positive and negative conductors includes a plate-shaped side portion extending from the main portion toward the base plate, and a terminal portion extending from the side portion and being joined to the base plate. The side portion is formed with a cutout extending from the end adjacent to the base plate to the opposite end connected to the main portion.

Other aspects and advantages of the invention will become apparent from the following description, taken in conjunction with the accompanying drawings, illustrating by way of example the principles of the invention.

BRIEF DESCRIPTION OF THE DRAWINGS

The features of the present invention that are believed to be novel are set forth with particularity in the appended claims. The invention together with objects and advantages thereof, may best be understood by reference to the following description of the presently preferred embodiments together with the accompanying drawings in which:

DETAILED DESCRIPTION OF ILLUSTRATIVE EMBODIMENTS

The following will describe a three-phase inverter 11 according to the first embodiment of the present invention with reference to FIGS. 1 through 9. Referring to FIG. 1A, the inverter 11 has an inverter circuit 12 including six switching devices Q1, Q2, Q3, Q4, Q5 and Q6. MOSFET (metal-oxide-semiconductor field-effect transistor) is used for the switching devices Q1 through Q6. In the inverter circuit 12, the serially connected switching devices Q1 and Q2, Q3 and Q4, and Q5 and Q6 are connected in parallel. Diodes D1, D2, D3, D4, D5 and D6 are inversely connected in parallel to the switching devices Q1, Q2, Q3, Q4, Q5 and Q6, respectively. Each of pairs of the switching device and the diode Q1 and D1, Q3 and D3, and Q5 and D5 is referred to as an upper arm. Each of pairs of the switching device and the diode Q2 and D2, Q4 and D4, and Q6 and D6 is referred to as a lower arm.

Figure 1A:
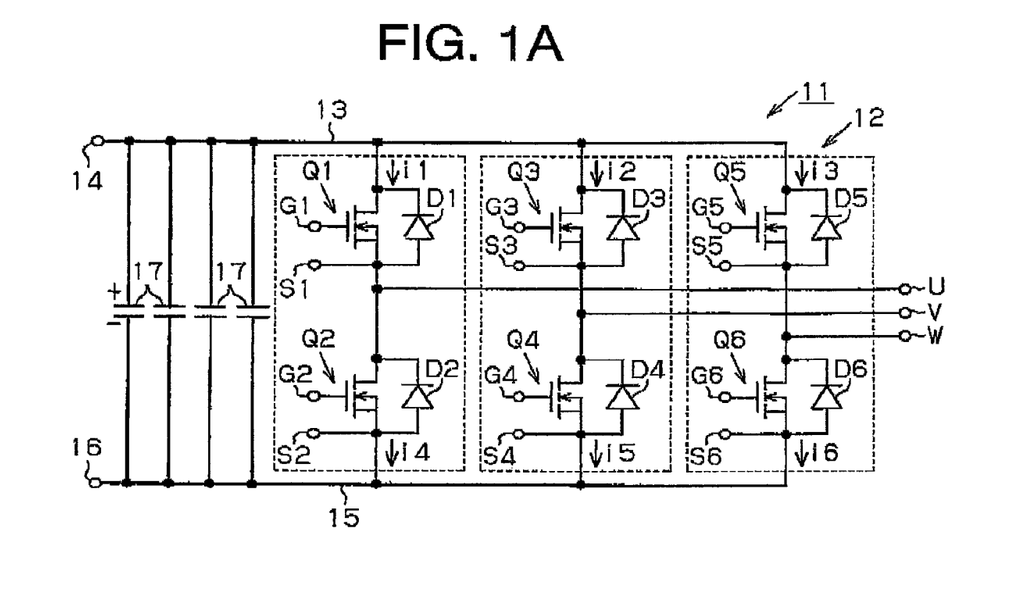
FIG. 1A is a circuit diagram of an inverter according to an embodiment of the present invention.

Each of the switching devices Q1, Q3 and Q5 has a drain connected to a positive input terminal 14 via a line 13, and each of the switching devices Q2, Q4 and Q6 has a source connected to a negative input terminal 16 via a line 15. Plural capacitors 17 are connected in parallel between the lines 13 and 15. In the present embodiment, an electrolytic capacitor is used for the capacitors 17. Each capacitor 17 has a positive terminal connected to the line 13 and a negative terminal connected to the line 15.

The node between the switching devices Q1 and Q2 is connected to a U-phase terminal U, the node between the switching devices Q3 and Q4 is connected to a V-phase terminal V, and the node between the switching devices Q5 and Q6 is connected to a W-phase terminal W. Each of the switching devices Q1, Q2, Q3, Q4, Q5 and Q6 has a gate connected to the signal terminals G1, G2, G3, G4, G5 and G6, and has a source connected to the signal terminals S1, S2, S3, S4, S5 and S6, respectively.

Figure 1B:
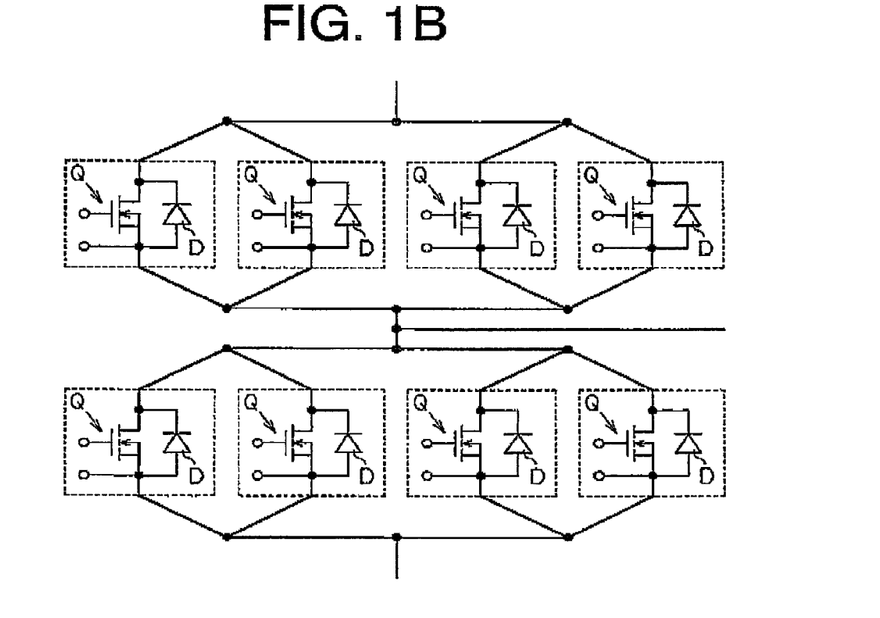
FIG. 1B is an example of a circuit diagram of one arm.

In FIG. 1A, each of the upper and lower arms is composed of one switching device and one diode. When the amount of current flowing through the arm is large, each arm may be composed of plural pairs of the switching device Q and the diode D connected in parallel, as shown in FIG. 1B. In the present embodiment, each arm is composed of four pairs of the switching device Q and the diode D.

The following will describe the structure of the inverter 11.

Figure 2:
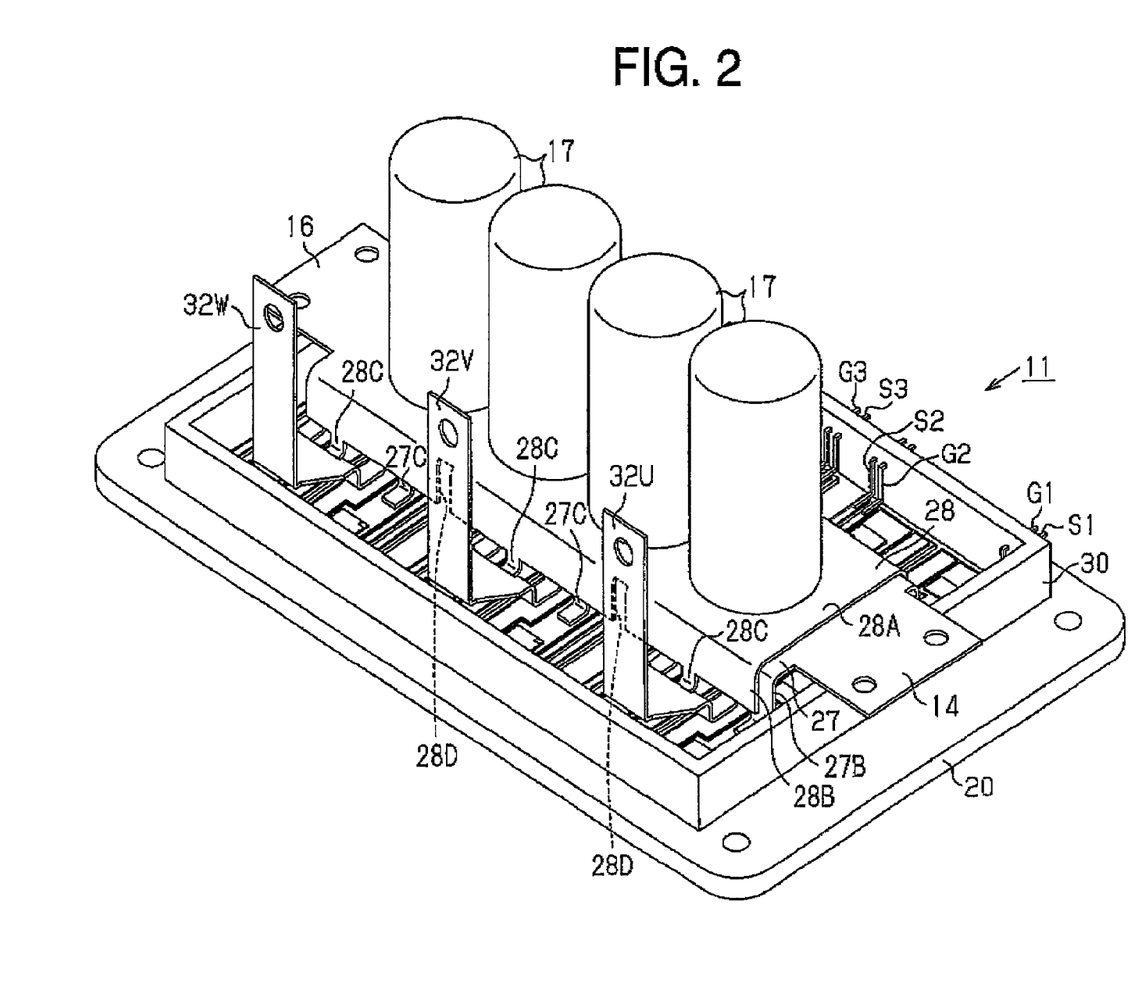
FIG. 2 is a perspective view of the inverter.
Figure 3:
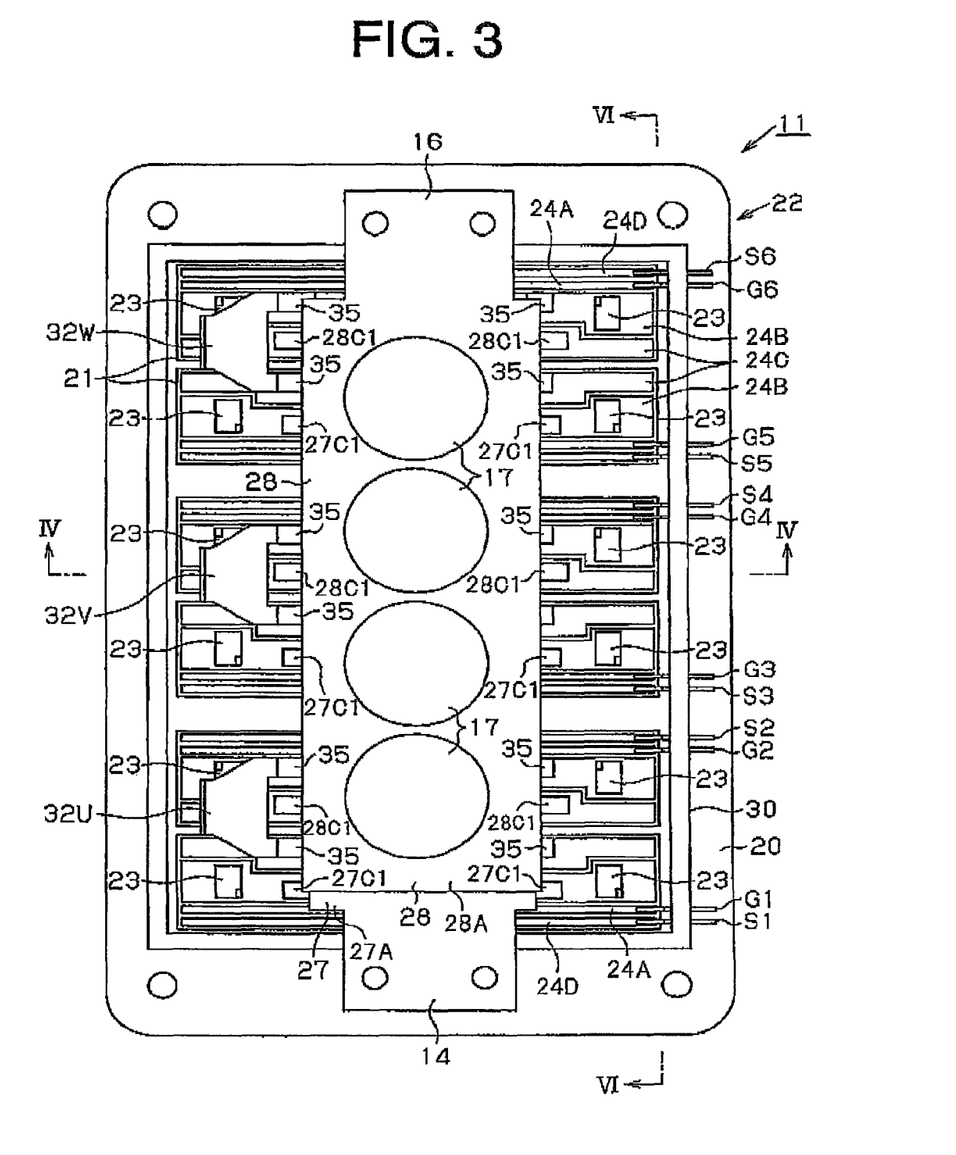
FIG. 3 is a plan view of the inverter.

Referring to FIGS. 2 and 3, the inverter 11 includes a metal base 20 (a metal plate), plural ceramic substrates 21, and plural semiconductor chips 23. The metal base 20 is made of copper and cooperates with the ceramic substrates 21 to form a base plate 22 on which the semiconductor chips 23 are mounted. The semiconductor chip 23 has one switching device (MOSFET) and one diode in combination as a one-chip device. That is, each semiconductor chip 23 has one switching device Q and one diode D of FIG. 1B.

Figure 4A:
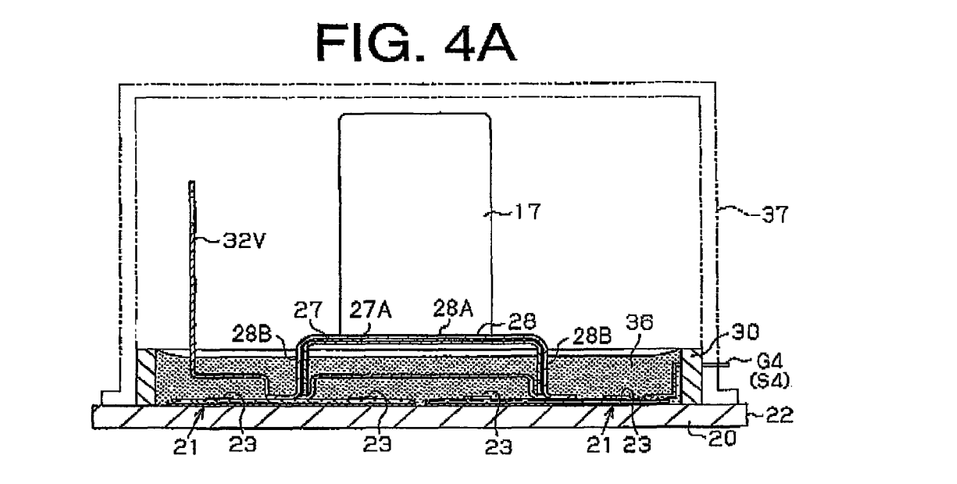
FIG. 4A is a cross-sectional view taken along the line IV-IV of FIG. 3.
Figure 4B:
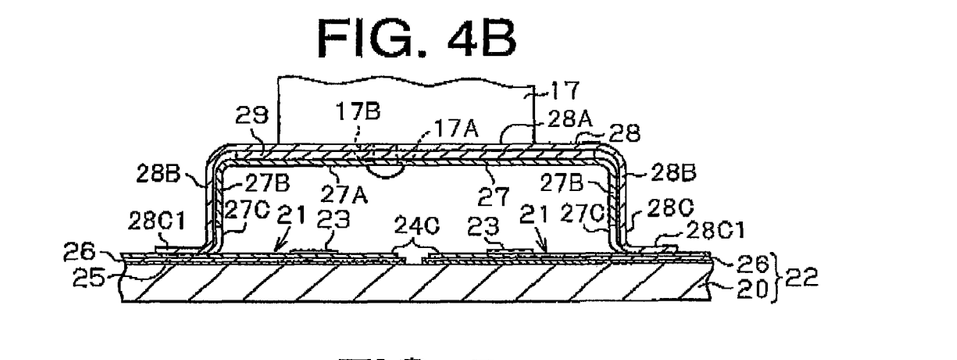
FIG. 4B is an enlarged fragmentary view of FIG. 4A.
Figure 5:
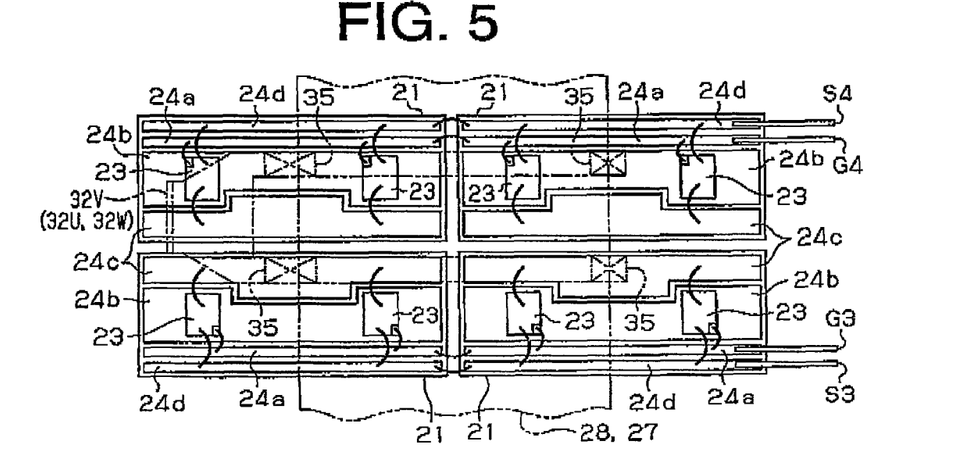
FIG. 5 is a plan view of ceramic substrates.

Referring to FIGS. 4B and 5, each ceramic substrate 21 has circuit patterns 24A, 24B, 24C and 24D formed on the upper surface of a ceramic plate 26. The ceramic plate 26 has on the lower surface thereof a metal sheet 25. The ceramic plate 26 is made of, for example, aluminum nitride, alumina or silicon nitride. The circuit patterns 24A, 24B, 24C and 24D and the metal sheet 25 are made of, for example, aluminum or copper. The ceramic substrate 21 is soldered to the metal base 20 through the metal sheet 25. Hereinafter, the metal base 20 is referred to as the bottom of the inverter 11.

In each ceramic substrate 21, the circuit pattern 24A is a line for a gate signal, the circuit pattern 24B is a line for a drain, the circuit pattern 24C is a line for a source, and the circuit pattern 24D is a line for a source signal. The circuit patterns 24A, 24B, 24C and 24D are in the form of a strip. The circuit patterns 24B and 24C are disposed adjacent to and parallel to each other. The circuit patterns 24A and 24D are disposed on the opposite side of the circuit pattern 24B from the circuit pattern 24C and extend parallel to the circuit pattern 24B. The semiconductor chip 23 is mounted on the circuit pattern 24B by soldering. The gate of the semiconductor chip 23 is electrically connected to the circuit pattern 24A by wire bonding, and the source of the semiconductor chip 23 is electrically connected to the circuit patterns 24C and 24D by wire bonding.

Figure 7A:
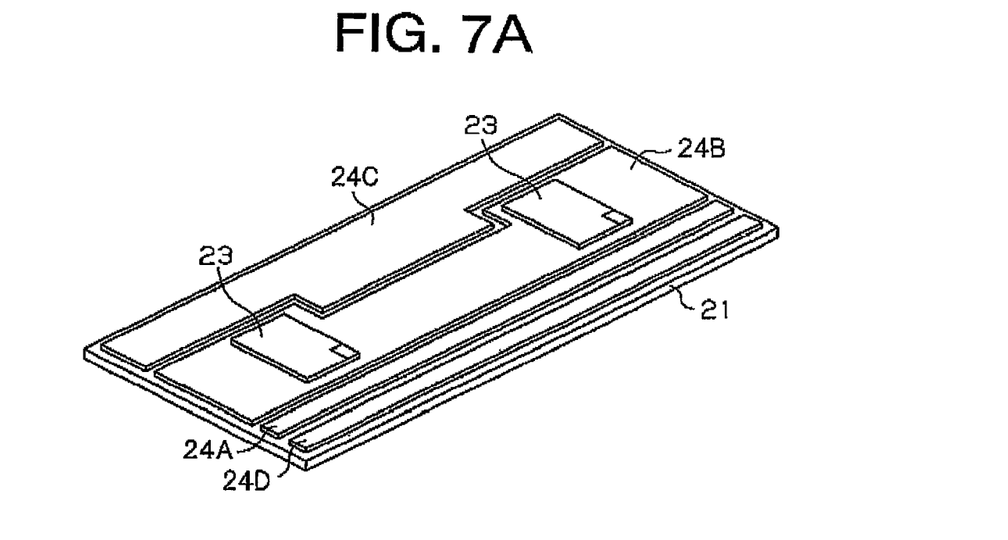
FIG. 7A is a perspective view of a ceramic substrate having thereon semiconductor chips.
Figure 7B:
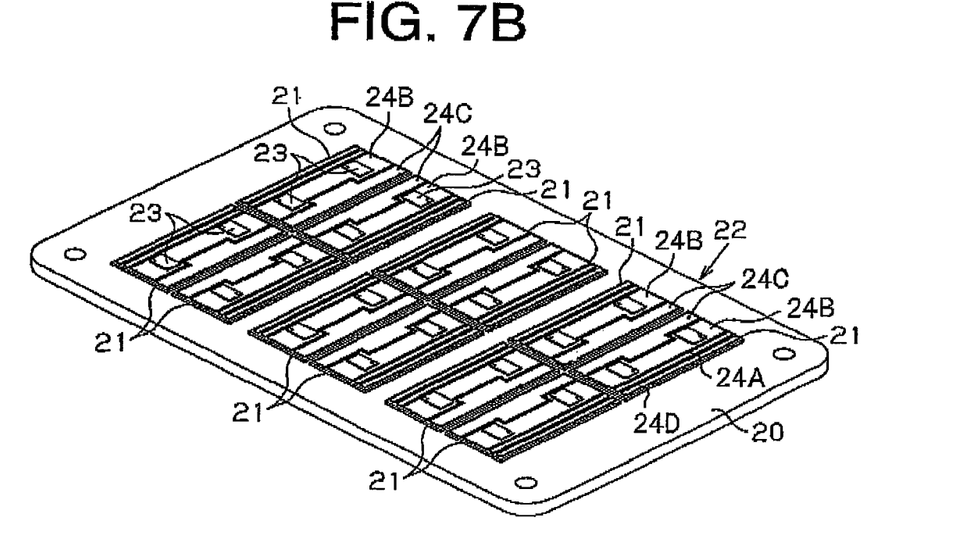
FIG. 7B is a perspective view of a metal base on which the ceramic substrates of FIG. 7A are mounted.

Referring to FIG. 7B, each of the metal base 20 and the ceramic substrates 21 has an approximately rectangular shape. A total of twelve ceramic substrates 21 are arranged in six rows and two columns on the metal base 20 so that longitudinal directions of the ceramic substrate 21 and the metal base 20 are perpendicular to each other. Each arm of the inverter circuit 12 (see FIG. 1A) is composed of the semiconductor chips 23 on the ceramic substrates 21 arranged in each column. In the present embodiment, each ceramic substrate 21 has two semiconductor chips 23 and, therefore, each arm is composed of four semiconductor chips 23. As shown in FIGS. 5 and 7A, two semiconductor chips 23 mounted on the circuit pattern 24B are spaced away from each other in longitudinal direction of the circuit pattern 24B.

Referring to FIGS. 3, 4A and 4B, a positive conductor 27 and a negative conductor 28 are disposed on the base plate 22. In the present embodiment, the negative conductor 28 is placed over the positive conductor 27. The positive and negative conductors 27 and 28 serve as the lines 13 and 15 of FIG. 1A, respectively.

The positive and negative conductors 27 and 28 include horizontal main portions 27A and 28A of a rectangular plate shape, respectively. One of the main portions 27A and 28A is placed over the other of the main portions 27A and 28A. The main portions 27A and 28A are insulated from and disposed adjacent to each other and extending parallel to the base plate 22. The positive conductor 27 further includes a pair of side portions 27B that extend from the lateral ends of the main portion 27A toward the base plate 22. The side portions 27B have a plate shape and are arranged symmetrically about the longitudinal axis of the main portion 27A. As with the positive conductor 27, the negative conductor 28 also includes a pair of side portions 28B. The side portions 27B and 28B are disposed adjacent to each other. In the positive and negative conductors 27 and 28, the plate-shaped side portions 27B and 28B extend from the respective main portions 27A and 28A parallel to each other to a position adjacent to the base plate 22 or the ceramic substrates 21.

The positive conductor 27 includes plural terminal portions 27C that extend from the lower end of the respective side portions 27B toward the base plate 22 and then bent so as to extend parallel to the main portion 27A. The plural terminal portions 27C are allocated at the end of the side portion 27B in spaced apart each other. In the present embodiment, the number of the terminal portions 27C extending from each side portion 27B is three and, therefore, the positive conductor 27 has a total of six terminal portions 27C. As with the positive conductor 27, the negative conductor 28 also includes plural terminal portions 28C. Each terminal portion 27C is mounted by ultrasonic bonding at a terminal end 27C1 thereof on the middle of the circuit pattern 24B of the ceramic substrate 21 of the upper arm. Each terminal portion 28C is also mounted by ultrasonic bonding at a terminal end 28C1 thereof on the middle of the circuit pattern 24C of the ceramic substrate 21 of the lower arm. As shown in FIG. 3, the terminal ends 27C1 and 28C1 are arranged approximately in a line at each side of the positive and negative conductors 27 and 28, respectively.

Figure 6A:
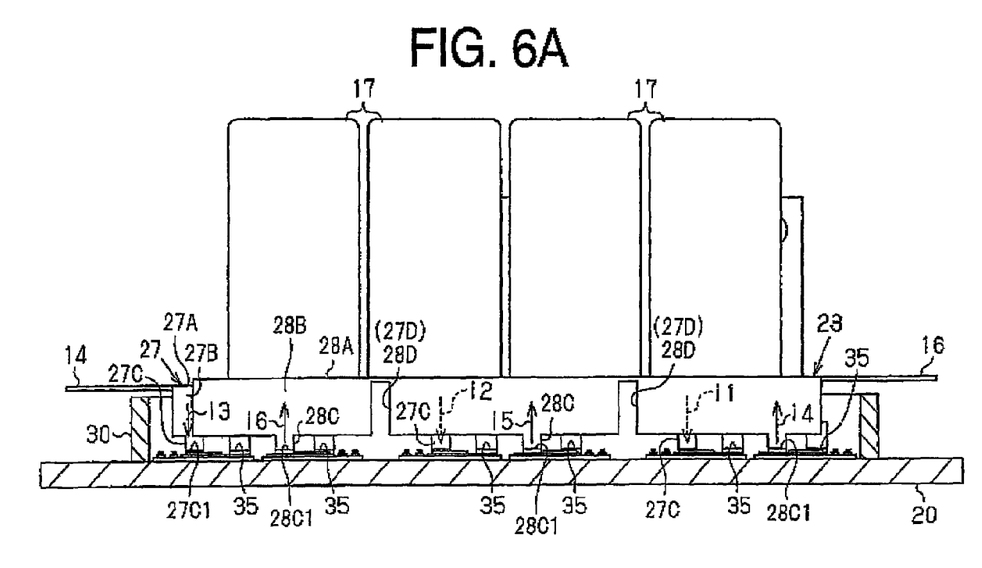
FIG. 6A is a cross-sectional view taken along the line VI-VI of FIG. 3.
Figure 6B:
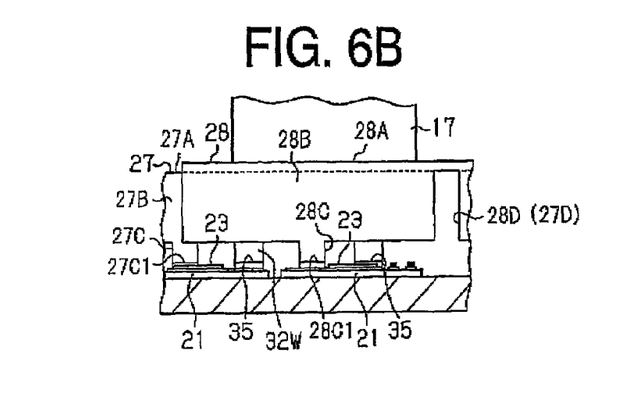
FIG. 6B is an enlarged fragmentary view of FIG. 6A.

Referring to FIG. 6, plural cutouts 27D are formed in the respective side portions 27B of the positive conductor 27. Each cutout 27D extends from the lower end to the upper end of the side portion 27B. In the positive conductor 27, each side portion 27B is mounted on the base plate 22 at the three terminal portions 27C, and the cutouts 27D are formed between the terminal portions 27C. The width of the cutout 27D is set so that silicone gel passes therethrough. As with the positive conductor 27, the negative conductor 28 also includes similar plural cutouts 28D formed in the respective side portions 28B. The cutouts 27D of the positive conductor 27 and the cutouts 28D of the negative conductor 28 are arranged so as to face each other.

Referring to FIG. 4B, an insulation sheet 29 is interposed between the main portions 27A and 28A of the positive and negative conductors 27 and 28. For example, a resin sheet can be used for the insulation sheet 29. Each of the main portions 27A and 28A and the insulation sheet 29 has therein an elongated hole (not shown) through which the positive terminal 17A and the negative terminal 17B of the capacitor 17 are inserted.

Referring to FIGS. 2 and 3, a non-conductive frame 30 of a rectangular shape is mounted around the ceramic substrates 21 on the metal base 20. The positive input terminal 14 is formed at a longitudinal end of the main portion 27A of the positive conductor 27 so as to extend outward of the frame 30. The negative input terminal 16 is formed at a longitudinal end of the main portion 28A of the negative conductor 28 opposite from the positive input terminal 14 so as to extend outward of the frame 30.

Referring to FIGS. 4A and 4B, the capacitor 17 is placed over the main portion 28A of the negative conductor 28 through an insulator (not shown). In the present embodiment, the inverter 11 has four capacitors 17 (see FIG. 2). The capacitor 17 has at the lower end thereof a positive terminal 17A and a negative terminal 17B. The positive terminal 17A is connected to the main portion 27A of the positive conductor 27, and the negative terminal 17B is connected to the main portion 28A of the negative conductor 28.

Referring to FIGS. 2 and 3, the inverter 11 includes electrodes 32U, 32V and 32W. Each of the electrodes 32U, 32V and 32W has an approximately L shape as viewed in longitudinal direction of the base plate 22. The electrodes 32U, 32V and 32W extend in transverse direction of the positive conductor 27 below the main portion 27A of the positive conductor 27 and bent upward at a position in the vicinity of the wall of the frame 30. The electrodes 32U, 32V and 32W are insulated from the positive conductor 27 through silicone gel 36 (see FIG. 4A), and the side portions 27B of the positive conductor 27 are also insulated from the side portions 28B of the negative conductor 28 through the silicone gel 36. The electrode 32U is connected by ultrasonic bonding to the circuit patterns 24C of the upper arm composed of the switching device Q1 and the diode D1, and to the circuit patterns 24B of the lower arm composed of the switching device Q2 and the diode D2. The electrode 32V is connected by ultrasonic bonding to the circuit patterns 24C of the upper arm composed of the switching device Q3 and the diode D3, and to the circuit patterns 24B of the lower arm composed of the switching device Q4 and the diode D4. The electrode 32W is connected by ultrasonic bonding to the circuit patterns 24C of the upper arm composed of the switching device Q5 and the diode D5, and to the circuit patterns 24B of the lower arm composed of the switching device Q6 and the diode D6.

The electrodes 32U, 32V and 32W are made by pressing a copper plate that has approximately the same width as the ceramic substrate 21. Referring to FIG. 5, each of the electrodes 32U, 32V and 32W has a total of four connecting portions 35, two of which are connected to the middle of the circuit patterns 24B of the ceramic substrates 21 of the upper arm. The remaining two connecting portions 35 are connected to the middle of the circuit patterns 24C of the ceramic substrates 21 of the lower arm. Referring to FIG. 8B, the electrodes 32U, 32V and 32W are bent substantially into an L shape. Each of the electrodes 32U, 32V and 32W has at the longitudinal end of the horizontal portion thereof two connecting portions 35 and at a position near the bend thereof further two connecting portions 35. Each of the electrodes 32U, 32V and 32W has a space 50 between the connecting portions 35 near the bend for receiving therein the terminal portion 28C of the negative conductor 28. The connecting portions 35 are connected to the circuit patterns 24B and 24C approximately in a line with the terminal ends 27C1 and 28C1 of the positive and negative conductors 27 and 28.

Referring to FIGS. 3 and 5, signal terminals G1, G2, G3, G4, G5 and G6 are connected to the respective circuit patterns 24A on the ceramic substrates 21 adjacent to the longitudinal ends of the electrodes 32U, 32V and 32W. Signal terminals S1, S2, S3, S4, S5 and S6 are connected to the respective circuit patterns 24D on the ceramic substrates 21 adjacent to the longitudinal ends of the electrodes 32U, 32V and 32W. The signal terminals G1 through G6 and S1 through S6 are molded integrally with the frame 30. The circuit patterns 24A of the ceramic substrates 21 of each arm are connected to each other by wire bonding, and the circuit patterns 24D of the ceramic substrates 21 of each arm are also connected to each other by wire bonding.

Referring to FIG. 4A, the silicone gel 36 is filled within the frame 30 for insulating and protecting the semiconductor chips 23. In addition, a cover 37 is mounted on the metal base 20 via bolts for surrounding the semiconductor chips 23, the positive and negative conductors 27 and 28, the capacitors 17, the electrodes 32U, 32V and 32W, and the frame 30.

The following will describe the method for manufacturing the inverter 11.

First, the semiconductor chips 23 are mounted on the ceramic substrates 21, as shown in FIG. 7A. Specifically, two semiconductor chips 23 are soldered to the circuit patterns 24B with a space formed therebetween in the longitudinal direction of the circuit pattern 24B. The gate of the semiconductor chip 23 is electrically connected to the circuit pattern 24A by wire bonding, and the source of the semiconductor chip 23 is electrically connected to the circuit patterns 24C and 24D by wire bonding, as shown in FIG. 5.

Next, the ceramic substrates 21 are mounted on the metal base 20, as shown in FIG. 7B. Specifically, the ceramic substrates 21 are arranged in six rows and two columns and soldered to the metal base 20. The circuit patterns 24A of the ceramic substrates 21 of each arm are electrically connected by wire bonding, and the circuit patterns 24D of the ceramic substrates 21 of each arm are electrically connected by wire bonding, as shown in FIG. 5.

Figure 8A:
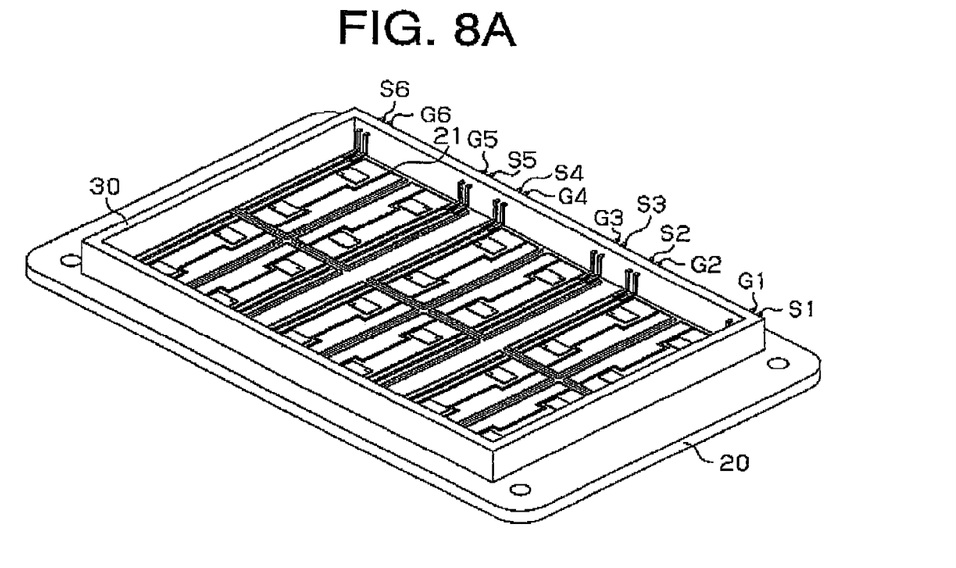
FIG. 8A is a perspective view of a frame mounted on the metal base of FIG. 7B.
Figure 8B:
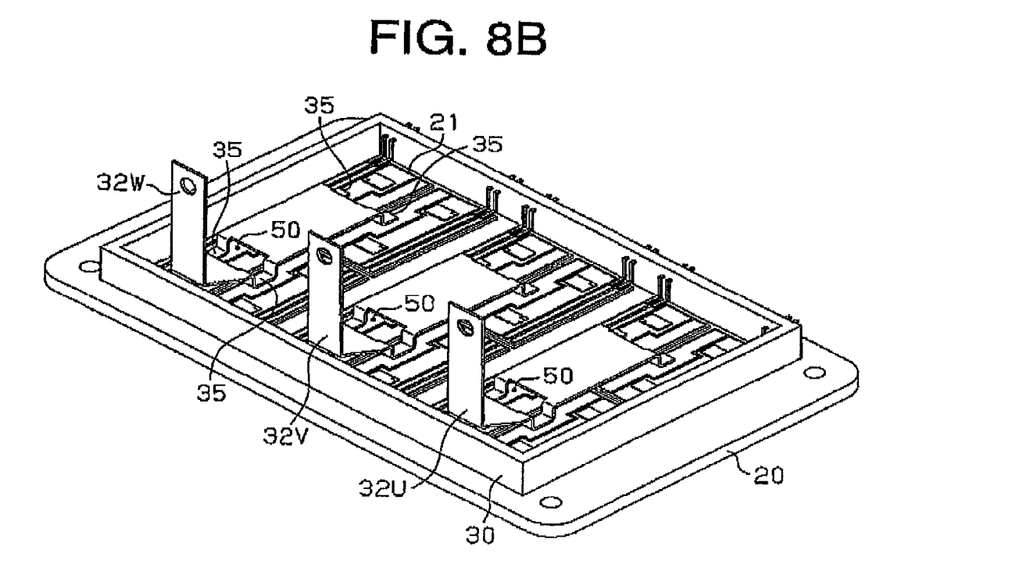
FIG. 8B is a perspective view of electrodes mounted on the metal base of FIG. 8A.

Next, the electrodes 32U, 32V and 32W are mounted on the ceramic substrates 21, as shown in FIGS. 8A and 8B. Specifically, after the frame 30 having signal terminals G1 through G6 and S1 through S6 is mounted on the metal base 20 so as to surround the ceramic substrates 21 by adhesives or screws, the electrodes 32U, 32V and 32W are mounted by ultrasonic bonding on the ceramic substrates 21, as shown in FIG. 8B. The electrodes 32U, 32V and 32W are connected to the middle of the corresponding circuit patterns 24B and 24D through the connecting portions 35, as shown in FIG. 5. The signal terminals G1 through G6 are connected to the corresponding circuit patterns 24A by ultrasonic bonding, and the signal terminals S1 through S6 are connected to the corresponding circuit patterns 24D by ultrasonic bonding.

Next, a capacitor assembly 38 (see FIG. 9) is assembled. Specifically, after four capacitors 17 are arranged and fixed by a jig in a line at a regular interval with the positive terminals 17A and the negative terminals 17B thereof facing upward, the negative conductor 28 is connected via insulators to the negative terminals 17B of the capacitors 17 by screws. The positive conductor 27 is placed over the negative conductor 28 via the insulation sheet 29 and connected to the positive terminals 17A of the capacitors 17 by screws. Thus, the positive and negative conductors 27 and 28 are electrically connected to the positive and negative terminals 17A and 17B of the capacitors 17, respectively, with the main portions 27A and 28A of the positive and negative conductors 27 and 28 insulated from each other, so that assembling of the capacitor assembly 38 is completed.

Figure 9:
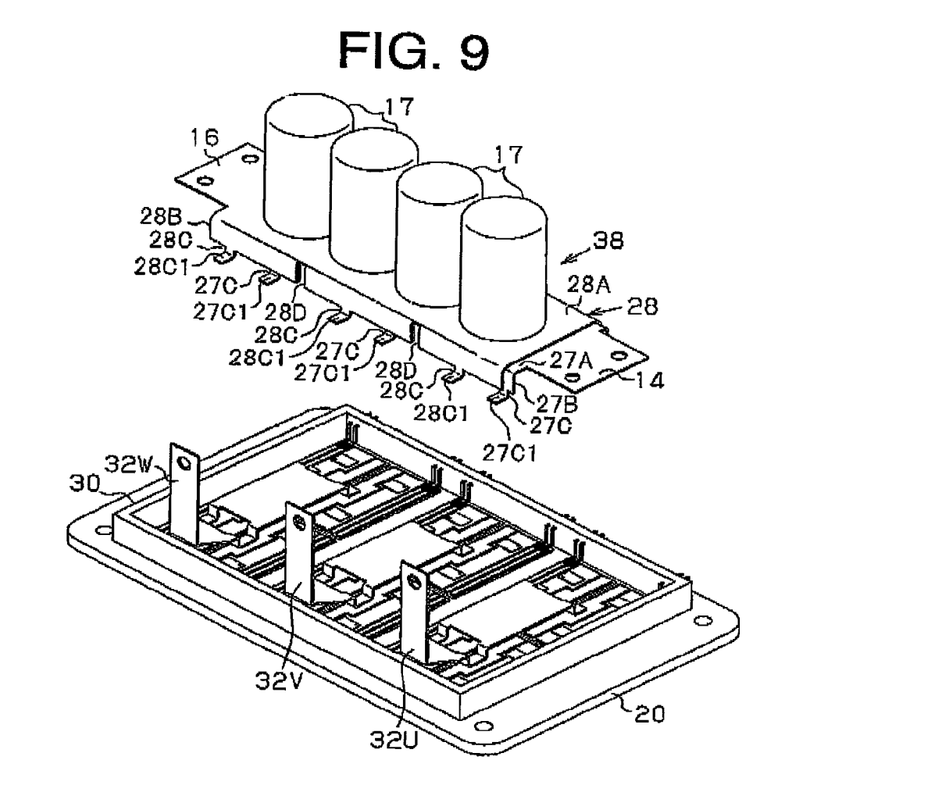
FIG. 9 is a perspective view of a capacitor assembly, showing positional relationship of the capacitor assembly, the metal base, the frame and the electrodes.

The capacitor assembly 38 thus completed is mounted on the ceramic substrates 21, as shown in FIG. 9. Specifically, the capacitor assembly 38 is placed within the frame 30 from above and arranged on the ceramic substrates 21. In such a case, the terminal ends 27C1 and 28C1 on each lateral side of the positive and negative conductors 27 and 28 are arranged approximately in a line (see FIG. 3).

The terminal ends 27C1 and 28C1 are then mounted by ultrasonic bonding on the corresponding circuit patterns 24B and 24C. In such a case, since the terminal end 27C1 and 28C1 are located near the capacitors 17, the capacitors 17 may be affected by heat if the terminal ends 27C1 and 28C1 are mounted by soldering. Particularly, an ordinary capacitor having no special heat resistance may be significantly affected by such heat. In the present embodiment, however, since the terminal ends 27C1 and 28C1 are mounted by ultrasonic bonding on the ceramic substrates 21, the amount of heat applied to the capacitors 17 is less and, therefore, the inverter 11 needs no special capacitor having special heat resistance.

Next, the silicone gel 36 is filled within the frame 30 for insulating and protecting the semiconductor chips 23, as shown in FIG. 4A. Since the cutouts 27D and 28D are formed in the side portions 27B and 28B of the positive and negative conductors 27 and 28, as shown in FIG. 6, the silicone gel 36 can flow smoothly into a clearance between the positive and negative conductors 27 and 28, as compared to a case wherein such cutouts are not provided. The cover 37 is then mounted on the metal base 26 via bolts, thus the manufacturing of the inverter 11 being completed.

The following will describe the operation of the inverter 11.

The inverter 11 is used as, for example, a part of a vehicle power supply. Referring to FIG. 1A, the positive input terminal 14 and the negative input terminal 16 are connected to a DC power supply (not shown). The U-phase terminal U, the V-phase terminal V and the W-phase terminal W are connected to a motor (not shown). The signal terminals G1 through G6 and the signal terminals S1 through S6 are connected to a controller (not shown).

When the switching devices Q1, Q3 and Q5 of the upper arms and the switching devices Q2, Q4 and Q6 of the lower arms are turned off or off in a given cycle, AC power is supplied to the motor, and the motor is driven, accordingly.

Such switching operation of the switching devices Q1 through Q6 causes rapid rise or fall of currents flowing through the positive and negative conductors 27 and 28 in opposite directions. Since the main portions 27A and 28A of the positive and negative conductors 27 and 28 have a plate shape and disposed parallel to and adjacent to each other, the line inductance is lowered by virtue of the mutual inductance. In addition, the side portions 27B and 28B of the positive and negative conductors 27 and 28 are also disposed parallel to and adjacent to each other, and the line inductance is efficiently lowered, accordingly.

Thus, the positive and negative conductors 27 and 28 of the present embodiment can lower the inductance of the line from the capacitors 17 to a position adjacent to the semiconductor chips 23. As a result, surge voltage generated due to the switching operation of the switching devices Q1 through Q6 is prevented, and the semiconductor chips 23 are protected from such surge voltage.

Since the metal base 20 serves as a heatsink, heat generated due to the operation of the switching devices Q1 through Q6 and the diodes D1 through D6 is transferred to the metal base 20, resulting in thermal deformation of the metal base 20. In such a case, stress may be applied to the connections between the positive and negative conductors 27 and 28 and the ceramic substrate 21. In the positive and negative conductors 27 and 28 of the present embodiment, the cutouts 27D and 28D are formed in the plate-shaped side portions 27B and 28B so as to extend in the direction that is perpendicular to the longitudinal direction of the main portions 27A and 28A. The cutouts 27D and 28D extend to the upper ends of the side portions 27B and 28B thereby to lower the above stress.

As described above, stress may be applied to the connections between the positive and negative conductors 27 and 28 and the ceramic substrate 21 under thermal cycle conditions due to the difference in thermal expansion coefficient between the metal base 20 and the ceramic substrate 21. In addition, stress may be applied to the connections also when the positive and negative conductors 27 and 28 are being mounted on the ceramic substrates 21, but such stress can be lowered by the presence of the cutouts 27D and 28D.

The cutouts 27D are formed in the side portions 27B between the terminal portions 27C mounted on the base plate 22, and the cutouts 28D are formed in the side portions 28B between the terminal portions 28C mounted on the base plate 22. Therefore, any stress applied to a region between the terminal portions 27C or between the terminal portions 28C due to the thermal deformation of the metal base 20 is less than heretofore. In addition, current flow is also restricted by the cutouts 27D and 28D. That is, referring to FIGS. 1A and 6A, currents i1, i2 and i3 flowing into the upper arms through the positive conductor 27 is restricted, and currents i4, i5 and i6 flowing out of the lower arms through the negative conductor 28 is also restricted.

The inverter 11 of the first embodiment offers the following advantages.

(1) In the positive and negative conductors 27 and 28, the plate-shaped side portions 27B and 28B extend from the main portions 27A and 28A toward the base plate 22. The terminal portions 27C and 28C extend from the side portions 27B and 28B and are mounted on the base plate 22. The cutouts 27D and 28D are formed in the side portions 27B and 28B so as to extend from the lower ends to the upper ends of the side portions 27B and 28B. Therefore, any stress applied to the connections between the positive and negative conductors 27 and 28 and the base plate 22 due to the thermal deformation of the base plate 22 can be lowered.

(2) The positive and negative conductors 27 and 28 include plural terminal portions 27C and 28C, respectively. The cutouts 27D are formed between the terminal portions 27C mounted on the base plate 22, and the cutouts 28D are formed between the terminal portions 28C mounted on the base plate 22. Therefore, any stress applied to a region between the terminal portions 27C or between the terminal portions 28D due to the thermal deformation of the base plate 22 can be efficiently lowered by the presence of the cutouts 27D and 28D.

(3) Because the capacitors 17 are mounted on the main portion 28A of the negative conductor 28 placed over the positive conductor 27 and not directly facing the base plate 22, the capacitors 17 can be integrated with the electronic components on the ceramic substrates 21 such as the semiconductor chips 23.

The above embodiment may be modified in various ways as exemplified below.

In the positive and negative conductors 27 and 28, the cutouts 27D and 28D may be formed so as to extend to a part of the main portions 27A and 28A beyond the upper end of the side portions 27B and 28B, as well as to extend to the upper end of the side portions 27B and 28B as in the foregoing embodiment. That is, the cutouts 27D and 28D need to extend at least to the upper ends of the side portions 27B and 28B.

The insulation sheet 29 of FIG. 4B may be replaced with a plate-shaped insulator such as a resin plate. Alternatively, the entire positive and negative conductors 27 and 28 may be insulated by gel.

The positive and negative conductors 27 and 28 may be mounted on the ceramic substrates 21 by laser welding or soldering. The electrodes 32U, 32V and 32W also may be mounted on the ceramic substrates 21 by laser welding or soldering, and the signal terminals G1 through G6 and the signal terminals S1 through S6 also may be mounted on the ceramic substrates 21 by laser welding or soldering In the embodiment, the main portions 27A and 28A of the positive and negative conductors 27 and 28 are disposed parallel to the base plate 22 adjacently to and insulated from each other so that the negative conductor 28 is placed over the positive conductor 27. Alternatively, the positive conductor 27 may be placed over the negative conductor 28. However, since the outer case of an electrolytic capacitor is grounded, it is preferable that the negative conductor 28 is arranged above the positive conductor 27 when such electrolytic capacitor is used for the capacitor 17.

Figure 10:
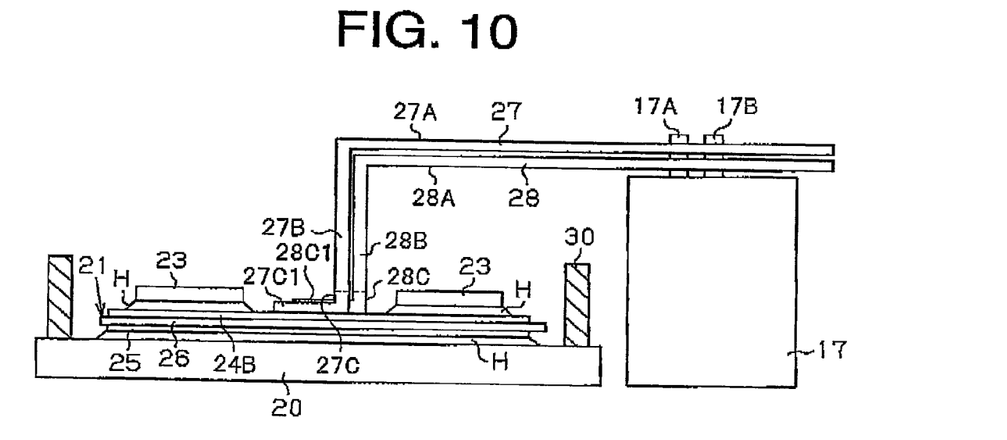
FIG. 10 is a schematic view of an inverter according to another embodiment of the present invention.

In the embodiment, the capacitors 17 are arranged on the base plate 22 or the metal base 20. Alternatively, the capacitors 17 may be arranged beside the metal base 20, as shown in FIG. 10. Referring to FIG. 10, the positive and negative conductors 27 and 28 are disposed parallel to each other so that the main portion 27A of the positive conductor 27 is arranged above the main portion 28A of the negative conductor 28. The side portions 27B and 28B extend downward from the ends of the main portions 27A and 28A, and the terminal portions 27C and 28C extend laterally from the lower ends of the side portions 27B and 28B. The positive conductor 27 is connected at the terminal end 27C1 to the circuit pattern 24B on the ceramic substrate 21, and the negative conductor 28 is connected at the terminal end 28C1 to the circuit pattern 24C on the ceramic substrate 21. The ceramic substrate 21 is mounted on the metal base 20 by a solder H, and the semiconductor chips 23 are mounted on the circuit pattern 24B by a solder H. In the present embodiment, each arm is composed of two semiconductor chips 23 mounted on one ceramic substrate 21, and six ceramic substrates 21 are arranged in a row in the direction perpendicular to the sheet of FIG. 10. It is noted that circuit patterns other than the circuit pattern 24B and components such as the electrode 32U are not illustrated in FIG. 10. Also in the present embodiment, the cutouts 27D and 28D are formed in the side portions 27B and 28B of the positive and negative conductors 27 and 28 so as to extend from the lower ends to at least the upper ends of the side portions 27B and 28B. Therefore, any stress applied to the connections between the positive and negative conductors 27 and 28 and the base plate 22 due to the thermal deformation of the base plate 22 can be lowered. In addition, the cutouts 27D are formed in the side portions 27B between the terminal portions 27C mounted on the base plate 22, and the cutouts 28D are formed in the side portions 28B between the terminal portions 28C mounted on the base plate 22. Therefore, any stress applied to the region between the terminal portions 27C or between the terminal portions 28C due to the thermal deformation of the metal base 20 is less.

Each arm may be composed of one ceramic substrate 21, as well as composed of two ceramic substrates 21 as in the foregoing embodiment. In such a case, wire-bonding connections between the circuit patterns 24A and between the circuit patterns 24D can be omitted. In addition, the positive conductor 27 can be mounted on the circuit pattern 24B in each arm at one terminal end 27C, and the negative conductor 28 can be also mounted on the circuit pattern 24C in each arm at one terminal end 28C. Similarly, each of the electrodes 32U, 32V and 32W can be mounted on the corresponding circuit patterns 24B and 24C in each arm at one connecting portion 35.

Plural arms may be composed on one ceramic substrate 21, as well as one arm being composed on one ceramic substrate 21.

A direct brazing aluminum substrate (DBA substrate) having aluminum layers on both upper and lower surface thereof may be used for the ceramic substrate 21, and such DBA substrate may be mounted on the metal base 20 made of aluminum-base metal. In such a case, the circuit patterns 24A, 24B, 24C and 24D are formed on the upper surface of the DBA substrate, and the lower surface of the DBA substrate is brazed to the metal base 20 with aluminum-base filler metal.

The ceramic substrate 21 may be replaced with a metal substrate having an insulation layer on which the circuit patterns 24A, 24B, 24C and 24D are formed.

The circuit patterns 24A, 24B, 24C and 24D may be formed on an insulation layer formed on the metal base 20, as well as on an insulating substrate soldered or blazed to the metal base 20. In such a case, the number of components is reduced, and the process of mounting an insulating substrate on the metal base 20 becomes unnecessary.

The number of the capacitors 17 may be less than or more than four, depending on the rated current of the inverter 11 and the capacitance of the capacitor 17.

An electric double-layer capacitor may be used for the capacitor 17.

Power transistors such as a thyristor or an insulated-gate bipolar transistor (IGBT) may be used for the switching devices Q, Q1, Q2, Q3, Q4, Q5 and Q6.

The number of the pairs of the switching device Q and the diode D in each arm may be less than or more than four, depending on the amount of current flowing through the arm. In addition, each arm may be composed of one pair of the switching device Q and the diode D.

The switching device and the diode may be mounted separately on the corresponding circuit patterns, as well as a pair of the switching device and the diode being incorporated in the semiconductor chip 23.

The inverter 11 may be composed of two pairs of upper arm and lower arm for generating single-phase AC.

The present invention may be applied to a DC-DC converter as a power converter.

The positive and negative conductors 27 and 28 may be connected to the positive terminal 17A and the negative terminal 17B of the capacitor 17 by precision resistance welding or laser beam welding. In such a case, the capacitor 17 is less affected by heat, as compared to a case wherein the positive terminal 17A and the negative terminal 17B of the capacitor 17 are soldered to the positive and negative conductors 27 and 28.

Therefore, the present examples and embodiments are to be considered as illustrative and not restrictive, and the invention is not to be limited to the details given herein but may be modified within the scope of the appended claims.

What is claimed:

1. A power converter, comprising:
a base plate having thereon a switching device;
a positive conductor and a negative conductor respectively including plate-shaped main portions being disposed parallel to the base plate, one of the main portions of the positive and negative conductors being placed over the other of the main portions of the positive and negative conductors, the main portions of the positive and negative conductors being disposed adjacent to and parallel to each other, the main portions of the positive and negative conductors being insulated from each other; and
a capacitor having a positive terminal and a negative terminal being electrically connected to the respective main portions of the positive and negative conductors,
wherein each of the positive and negative conductors includes a plate-shaped side portion extending from the main portion toward the base plate, and a terminal portion extending from the side portion and being joined to the base plate,
wherein the side portion is formed with a cutout extending from the end adjacent to the base plate to the opposite end connected to the main portion.

2. The power converter according to claim 1, wherein the base plate is formed by a metal plate and a ceramic substrate, the ceramic substrate having thereon a circuit pattern and being joined to the metal plate.

3. The power converter according to claim 1, wherein each of the positive and negative conductors includes the plural terminal portions allocated at the end of the side portion, and the side portion is formed with the cutout between the terminal portions in the respective positive and negative conductors.

4. The power converter according to claim 1, wherein the capacitor is mounted on one of the main portions of the positive and negative conductors that does not directly face the base plate.

5. The power converter according to claim 1, wherein the side portions of the positive and negative conductors are disposed parallel to and adjacent to each other so that the cutouts of the positive and negative conductors face each other.

6. The power converter according to claim 1, wherein each of the positive and negative conductors includes the side portion being formed with the cutout extending from the end adjacent to the base plate to a part of the main portion through the opposite end connected to the main portion.

7. The power converter according to claim 1, wherein the side portion extends from the lateral ends of the main portion, and the terminal portion extends from the end of the side portion adjacent to the base plate toward the base plate and bent so as to extend parallel to the main portion.

* * * * *